(12) United States Patent
Schicke, II (10) Patent No.: US 10,134,550 B2
(45) Date of Patent: Nov. 20, 2018

(54) SHORT CIRCUIT DETECTION CIRCUIT

(71) Applicant: ASCO Power Technologies, L.P., Florham Park, NJ (US)

(72) Inventor: Robert W. Schicke, II, Denville, NJ (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 359 days.

(21) Appl. No.: 15/162,015

(22) Filed: May 23, 2016

(65) Prior Publication Data

US 2016/0343526 A1    Nov. 24, 2016

Related U.S. Application Data

(60) Provisional application No. 62/165,174, filed on May 21, 2015.

(51) Int. Cl.
*H01H 47/00* (2006.01)
*G01R 31/02* (2006.01)

(52) U.S. Cl.
CPC ......... *H01H 47/002* (2013.01); *G01R 31/025* (2013.01)

(58) Field of Classification Search
USPC ............................................ 361/190; 307/23
See application file for complete search history.

(56) References Cited

U.S. PATENT DOCUMENTS

| 4,423,336 | A | | 12/1983 | Iverson et al. |
| 4,810,972 | A | * | 3/1989 | Appleby, Jr. ........ G01R 31/025 |
| | | | | 324/509 |
| 5,612,580 | A | | 3/1997 | Janonis et al. |
| 6,201,479 | B1 | * | 3/2001 | Zydek ..................... B60R 16/03 |
| | | | | 324/511 |
| 6,232,781 | B1 | * | 5/2001 | Goser ................... F02D 41/221 |
| | | | | 324/415 |
| 7,468,566 | B2 | | 12/2008 | Serrano et al. |
| 7,973,253 | B2 | | 7/2011 | Gibbs et al. |
| 9,817,052 | B2 | * | 11/2017 | Cecco .................. G01R 31/025 |
| 2006/0028069 | A1 | | 2/2006 | Loucks et al. |

(Continued)

FOREIGN PATENT DOCUMENTS

CN    101453106 B    10/2012

*Primary Examiner* — Ronald W Leja (74) *Attorney, Agent, or Firm* — Harness, Dickey & Pierce, P.L.C.

(57) ABSTRACT

A short circuit detection circuit for an electrical circuit includes a secondary power supply. The electrical switch is connected in series with a load and is selectively connected in series with a first power supply. The secondary power supply is limited in comparison to the first power supply in terms of voltage and/or current. A first resistance is electrically connected between the secondary power supply and a first terminal of the electrical switch. A voltage measurement circuit measures a voltage at the second end of the first resistance. A controller is configured to, while the electrical switch is controlled to an open state, energize the secondary power supply and obtaining a first voltage measurement. In response to the first voltage measurement indicating that a voltage across the first resistance is greater than a predetermined threshold, the controller identifies a low-resistance condition in the electrical switch.

20 Claims, 7 Drawing Sheets

(56) References Cited

U.S. PATENT DOCUMENTS

| | | | |
|---|---|---|---|
| 2006/0294425 A1* | 12/2006 | Kollner | G01R 31/025 714/30 |
| 2010/0141047 A1 | 6/2010 | Gibbs et al. | |
| 2012/0242169 A1* | 9/2012 | Chauvet | F16K 31/0675 307/113 |
| 2013/0049476 A1 | 2/2013 | Lathrop | |
| 2013/0214805 A1* | 8/2013 | Saloio, Jr. | H02H 3/044 324/750.01 |
| 2013/0272039 A1* | 10/2013 | Saniter | G01R 31/025 363/55 |
| 2014/0098581 A1* | 4/2014 | Takizawa | H02M 7/538 363/56.01 |
| 2015/0067378 A1* | 3/2015 | Kobayashi | G01R 31/025 713/340 |
| 2015/0168476 A1* | 6/2015 | Park | G01R 31/025 324/549 |
| 2015/0268289 A1* | 9/2015 | Onodera | G01R 31/025 324/750.3 |
| 2016/0343526 A1* | 11/2016 | Schicke, II | H01H 47/002 |

* cited by examiner

SHORT CIRCUIT DETECTION CIRCUIT

CROSS-REFERENCE TO RELATED APPLICATIONS

This application claims the benefit of U.S. Provisional Application No. 62/165,174, filed on May 21, 2015. The entire disclosure of the application referenced above is incorporated by reference.

FIELD

The present disclosure relates to failure detection in electrical circuits and more particularly to detecting a low resistance condition in an electrical switch.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A power supply system may include one or more transfer switches to switch a load between a primary power source and a backup power source. For example, loads, such as hospitals, refrigeration systems, cell towers, and data centers require a consistent and reliable supply of electrical power. The load receives the electrical power from an electrical grid that delivers electricity from suppliers to consumers. Power from the electrical grid may be interrupted due to, for example, inclement weather, unforeseen accidents, and/or maintenance. Accordingly, a backup power supply, such as a generator, is used to maintain power to the load with as little interruption as possible. One or more uninterruptible power supply (UPS) devices may be used to power some or all of the load until the backup power supply is on-line.

Figure 1:
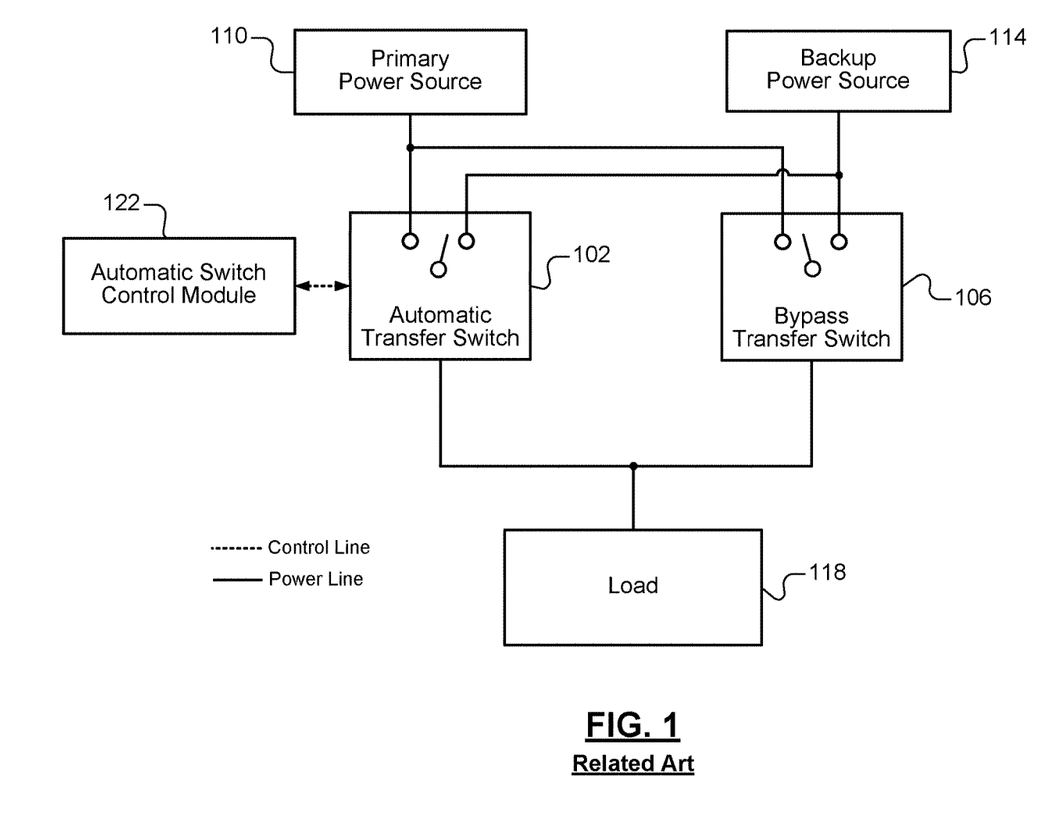
FIG. 1 is a block diagram of an example power supply system according to related art.

In FIG. 1, a functional block diagram of an example power supply system is presented. The power supply system includes an automatic transfer switch 102 and a bypass transfer switch 106 (collectively referred to as transfer switches 102, 106). The transfer switches 102, 106 are operable to electrically connect to a primary power source 110 and a backup power source 114 (collectively referenced as power sources 110, 114). The transfer switches 102, 106 switch a load 118 between the primary power source 110 and the backup power source 114 such that the load 118 receives power from one of the power sources 110, 114.

The automatic transfer switch 102 includes an automatic switch control module 122 for monitoring and switching between the primary power source 110 and the backup power source 114. Specifically, the automatic transfer switch 102 may automatically switch from the primary power source 110 to the backup power source 114 in response to a voltage output by the primary power source 110 decreasing below an expected operating range. The automatic transfer switch 102 may automatically switch back to the primary power source 110 from the backup power source 114 in response to the voltage output by the primary power source 110 returning to the expected operating range.

The bypass transfer switch 106 is disposed in parallel with the automatic transfer switch 102, and can be a non-automatic transfer switch operable by an operator. The bypass transfer switch 106 can act as a backup to the automatic transfer switch 102 when the automatic transfer switch 102 is off-line. In particular, in the event that the automatic transfer switch 102 is taken off-line for, as an example, maintenance, the bypass transfer switch 106 is used to control the electrical power being supplied to the load 118.

The automatic transfer switch 102 includes a series of relays that connect the load 118 to each of the power sources 110, 114. The automatic switch control module 122 actuates the appropriate relay for electrically connecting the load 118 to one of the power sources 110, 114. It is important that the automatic transfer switch 102 not connect both of the two power sources 110, 114 to the load 118 at the same time. Such a simultaneous connection shorts the primary power source 110 and the backup power source 114 together, an undesirable situation that may cause damage to the load 118, the automatic transfer switch 102, and other components associated with the two power sources 110, 114.

SUMMARY

An electrical switch is connected in series with a load and is selectively connected in series with a first power supply. A short circuit detection circuit for the electrical circuit includes a secondary power supply. The secondary power supply is limited in comparison to the first power supply in terms of at least one of an operating voltage and an available current. The short circuit detection circuit includes a first resistance. A first end of the first resistance electrically connected to the secondary power supply. A second end of the first resistance is electrically connected to a first terminal of the electrical switch. The short circuit detection circuit includes a voltage measurement circuit configured to measure a voltage at the second end of the first resistance. The short circuit detection circuit includes a controller configured to, while a control signal present at a control terminal of the electrical switch is in an open state, perform a first sequence of operations. The first sequence includes energizing the secondary power supply and, while the secondary power supply is energized, obtaining a first voltage measurement from the voltage measurement circuit. The first sequence includes, in response to the first voltage measurement indicating a voltage across the first resistance is greater than a predetermined threshold, identifying a low-resistance condition in the electrical switch. The first sequence includes, subsequent to obtaining the first voltage measurement, de-energizing the secondary power supply. The open state of the control signal controls the electrical switch to create an open circuit between the first terminal of the electrical switch and a second terminal of the electrical switch.

In other features, the controller is configured to perform the first sequence of operations prior to the first power supply being electrically connected to the electrical switch. In other features, the controller is also configured to perform the first sequence of operations subsequent to the first power supply being electrically disconnected from the electrical switch.

In other features, the controller is configured to, while the control signal present at the control terminal of the electrical switch is in a closed state, perform a second sequence of operations. The second sequence includes, while the secondary power supply is energized, obtaining a second voltage measurement from the voltage measurement circuit. The second sequence includes, in response to the second voltage measurement indicating the voltage across the first resistance is less than a second predetermined threshold, identifying a switching deficiency in the electrical switch. The closed state of the control signal controls the electrical switch to create a short circuit between the first and second terminals of the electrical switch.

In other features, the second predetermined threshold is equal to the predetermined threshold. In other features, the second predetermined threshold is less than the predetermined threshold. In other features, the second predetermined threshold is greater than the predetermined threshold. In other features, the first power supply is selectively connected to the electrical switch by an electromechanical relay. In other features, a diode is configured to electrically connect the second end of the first resistance to the electrical switch. In other features, the load includes an inductive loop configured to change a state of a mechanical bistable device.

A transfer switch is operable to alternately connect a load to first and second power sources. A failure detector for the transfer switch includes a short circuit sensor and a control module. The short circuit sensor includes a detector power source and a voltage indicator. The detector power source applies an input voltage to a power switch within the transfer switch. The voltage indicator senses a first voltage across the power switch at a first node. The voltage indicator generates a first output in response to the first voltage being greater than a predetermined threshold and outputs a second output in response to the first voltage being less than the predetermined threshold. The control module energizes the detector power source and, in response to the first output, declares that the transfer switch is normal, and in response to the second output, declares that the transfer switch has a short circuit.

In various features, a transfer switching system includes the failure detector and the transfer switch. The transfer switch includes an electromechanical switch that selectively connects the load to the first power source. The power switch actuates the electromechanical switch. In other features, the electromechanical switch is stable in (i) a first state where the load and the first power source are electrically connected and (ii) a second state where the load and the first power source are electrically disconnected.

In other features, the power switch actuates the electromechanical switch using power from a power converter. The detector power source supplies less power to the power switch than does the power converter. In other features, the transfer switch further includes a second electromechanical switch that selectively connects the load to the second power source and a second power switch that actuates the second electromechanical switch. The power switch and the second power switch are connected in parallel. The control module declaration that the transfer switch has the short circuit indicates that at least one of the power switch and the second power switch is short-circuited.

In other features, the control module also controls whether the load is connected to the first power source and whether the load is connected to the second power source. In other features, the short circuit sensor further includes a diode connected between the first node and the power switch. In other features, the short circuit sensor further includes a resistor connected between the first node and the detector power source. In other features, the detector power source is an isolated power supply. The voltage indicator includes an optocoupler. In other features, the isolated power supply also provides power to a first driver that drives a control terminal of the power switch.

In other features, the voltage indicator includes a resistor and at least one series-connected diode. In other features, the at least one series-connected diode includes four diodes connected in series. In other features, the voltage indicator includes an optocoupler. An input of the optocoupler is in series with the resistor and the at least one series-connected diode. An output of the optocoupler provides the output from the short circuit sensor to the control module. In other features, the short circuit sensor includes a pull-up resistor connected between a voltage supply and the output of the optocoupler. In other features, the control module generates an alarm in response to the transfer switch having a short circuit. The alarm is at least one of visual and audible.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

According to a control signal, an electrical switch may selectively apply a power supply to a load. Before the power supply is connected to the electrical switch, a lower-power secondary supply can be used to test whether there is a low-resistance condition (such as a short circuit) in the electrical switch. This prevents inadvertent connection of the power supply to the load due to the low-resistance condition of the electrical switch.

While the control signal is instructing the electrical switch to remain open, the secondary supply is applied to the electrical switch through a first resistance of a known value, such as a discrete resistor. If a low-resistance condition is present in the electrical switch, the majority of the voltage of the secondary supply will be dropped across the first resistance. Meanwhile, if no low-resistance condition is present in the electrical switch, there may be no voltage drop across the first resistance. These conditions may therefore be differentiated by measuring the voltage across the first resistance (or, equivalently, the voltage at the terminal of the first resistance opposite to the terminal of the first resistance connected to the secondary supply).

If a low-resistance condition is not detected, switching operation of the electrical switch may also be tested. Specifically, while the secondary supply is applied to the electrical switch, the control signal may be adjusted to instruct the electrical switch to close. Upon closing, the electrical switch will present a low resistance, and a majority of the secondary supply's voltage will be dropped across the first resistance. Once this has been verified by measurement, the control signal can then instruct the electrical switch to reopen. Opening of the electrical switch can be confirmed by the voltage drop across the first resistance decreasing.

The secondary supply may be connected to the electrical switch via a diode to prevent the primary power supply from feeding back to the secondary supply. The secondary supply is lower-power so that there is not sufficient power to activate the load during testing. For example, in one application described below, the load may be a mechanical bistable device used in a transfer switch to selectively connect and disconnect primary and secondary power sources. While the present disclosure is relevant to other power switching applications, its use in a transfer switch is described for purposes of illustration.

A transfer switch, such as a non-automatic bypass transfer switch, is configured to switch a load between a primary power source and a backup power source. When a short circuit is present within the transfer switch, the transfer switch may exhibit unintended behavior, such as connecting both power sources to the load simultaneously. A transfer switch implementing a short circuit sensor as described in the present disclosure attempts to detect the presence of a short circuit within the transfer switch, thereby preventing unsafe operating conditions of the transfer switch.

As an example, the transfer switch may include an electromechanical switch for connecting the load to one of the power sources. The electromechanical switch may include a relay or may include a mechanical bistable device that is actuated by a power semiconductor device to one of two states: in one, the mechanical bistable device connects the load to the power source and, in the other, the mechanical bistable device disconnects the load from the power source. If the power semiconductor device is shorted, the mechanical bistable device may be switched between these states unintentionally.

To test for a short circuit, a test power source is applied to one terminal of the power semiconductor device and a measurement is made of the voltage at that terminal of the power semiconductor device. If the power semiconductor device is not shorted, the short circuit sensor should detect a voltage approximately equal to the input voltage. If the power semiconductor device is shorted, the short circuit sensor may detect a voltage approximately equal to the voltage at the other terminal of the power semiconductor device (which may be ground, or 0 Volts). Based on the measured voltage, a determination can then be made regarding whether the power semiconductor device has failed in a shorted or nearly shorted state. The test power source may be configured to provide a small enough current to the power semiconductor device that the mechanical bistable device is not switched to a different state by the short circuit test. A second power semiconductor device may control application of a second power source to the load, and may be tested similarly.

Block Diagrams

Figure 2:
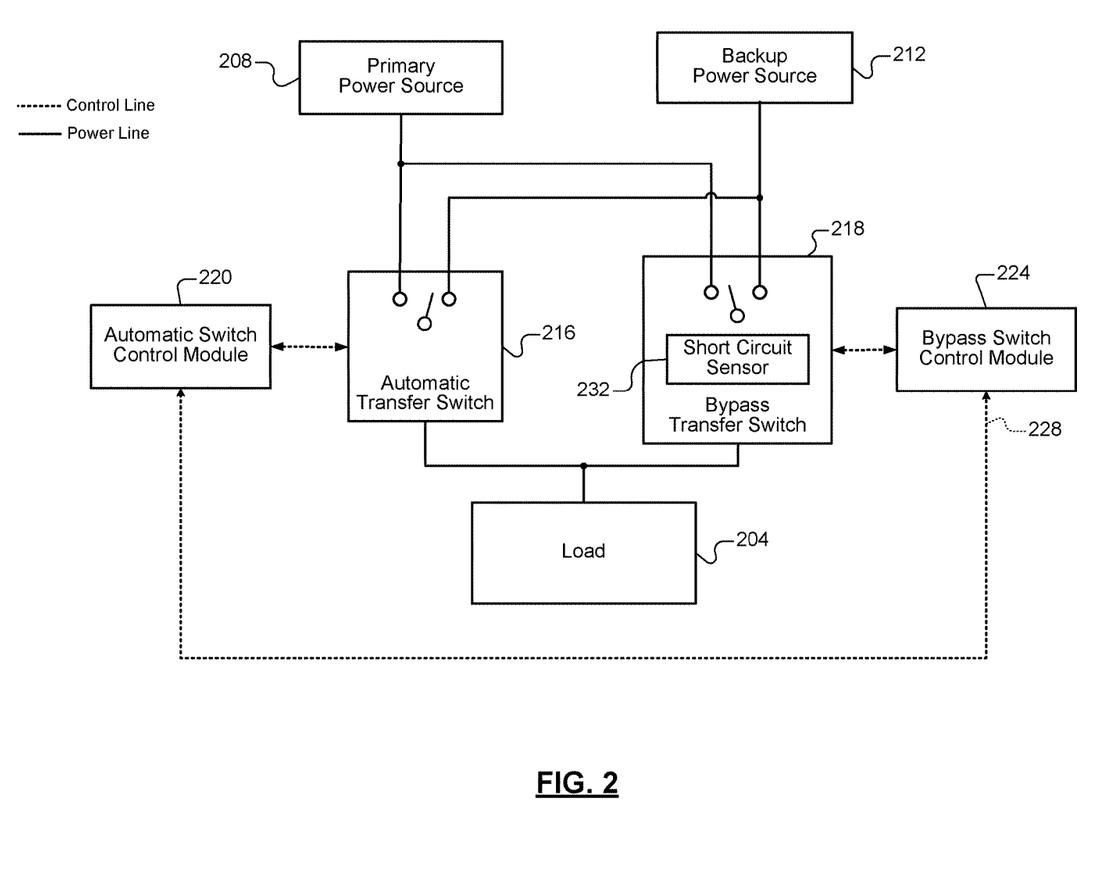
FIG. 2 is a block diagram of an example power supply system including a short circuit sensor of the present disclosure.

In FIG. 2, an example power supply system is shown. The power supply system supplies electrical power to a load 204 from a primary power source 208 or a backup power source 212 (collectively referred to as power sources 208, 212). The load 204 may be, for example, a commercial site, a residential site, and/or other facility that receives electrical power. The primary power source 208 may be power provided by a utility company by way of an electrical grid system. The backup power source 212 may include a generator, batteries, and/or other apparatus for supplying power to the load 204 when power from the primary power source 208 is interrupted.

The power supply system may include an automatic transfer switch (ATS) 216 and a bypass transfer switch (BTS) 218 (collectively referred to as transfer switches 216, 218). The transfer switches 216, 218 switch the load 204 between the primary power source 208 and the backup power source 212 to deliver a substantially continuous supply of electric power to the load 204. The transfer switches 216, 218 are disposed in parallel, and each of the transfer switches 216, 218 connect to the load 204 and to a respective one of the power sources 208, 212. While the example embodiment illustrates the power supply system as including both the ATS 216 and the BTS 218, the present disclosure is also applicable to implementations with only a single transfer switch.

The ATS 216 automatically switches between the primary power source 208 and the backup power source 212 based on the level of power being supplied by the primary power source 208. In particular, an automatic switch control module 220 controls the ATS 216 to switch the load 204 to the backup power source 212 in the event the primary power source 208 is supplying an inadequate amount of electric power to the load 204. For example, the automatic switch control module 220 may monitor the voltage level of the electrical power being supplied by the primary power source 208, and when the voltage level decreases below a predetermined threshold, the automatic switch control module 220 may control the ATS 216 to switch the load 204 to the backup power source 212, such that the load 204 receives electrical power from the backup power source 212. The automatic switch control module 220 is configured to switch the load 204 between the primary power source 208 and the backup power source 212 automatically, or, in other words, without any intervention by an operator.

The BTS 218 may be a non-automatic type transfer switch such that the BTS 218 receives an input from an operator for switching the load 204 between the power sources 208, 212. The BTS 218 may have one or more control switches accessible by the operator. A bypass switch control module 224 controls the BTS 218 based on the operation of the one or more control switches. For example, one switch may be provided to initiate a power up procedure of the BTS 218 (when the BTS 218 is taking over from the ATS 216) and another switch may be provided to initiate a transfer procedure of the BTS 218 (when switching control is being returned to the ATS 216). The bypass switch control module 224 may be a complex programmable logic device that controls the components disposed within the BTS 218.

The BTS 218 may act as a backup transfer switch to the ATS 216 in the event the ATS 216 is off-line. To switch between the ATS 216 and the BTS 218, the operator may perform a manual operation in which the ATS 216 is taken off-line as the active transfer switch and the BTS 218 is turned on as the active transfer switch. In addition, the ATS 216 may be isolated from the power sources 208, 212 and the load 204. However, if the ATS 216 is still physically connected to the power sources 208, 212 and the load 204, the bypass switch control module 224 may transmit an inhibit signal 228 to the automatic switch control module 220 to prevent the ATS 216 from operating as the active transfer switch.

The BTS 218 includes a short circuit sensor 232 for detecting a short circuit within the BTS 218. That is, the short circuit sensor 232 tests a component within the BTS 218 for a short circuit. The short circuit sensor 232 applies a voltage to the component and detects the voltage at an input of the component, as described below. Based on the detected voltage, the bypass switch control module 224 determines whether the component of the BTS 218 is shorted.

In an example embodiment, before the BTS 218 is electrically connected to the power sources 208, 212, the bypass switch control module 224 may administer a short circuit detection routine to verify the operation of the BTS 218. If a short circuit is present, the bypass switch control module 224 operates the BTS 218 according to an abnormal operation routine in which the BTS 218 issues a notification of the short circuit by way of an alarm, and stops the power-up process of the BTS 218. If a short circuit is not present, the bypass switch control module 224 operates the BTS 218 in accordance with a normal operation routine in which the BTS 218 is turned on, such as by supplying power to components of the BTS 218 from at least one of the power sources 208, 212. Once powered up, the BTS 218 can be manually controlled to connect one or the other of the power sources 208, 212 to the load 204.

Figure 3A:
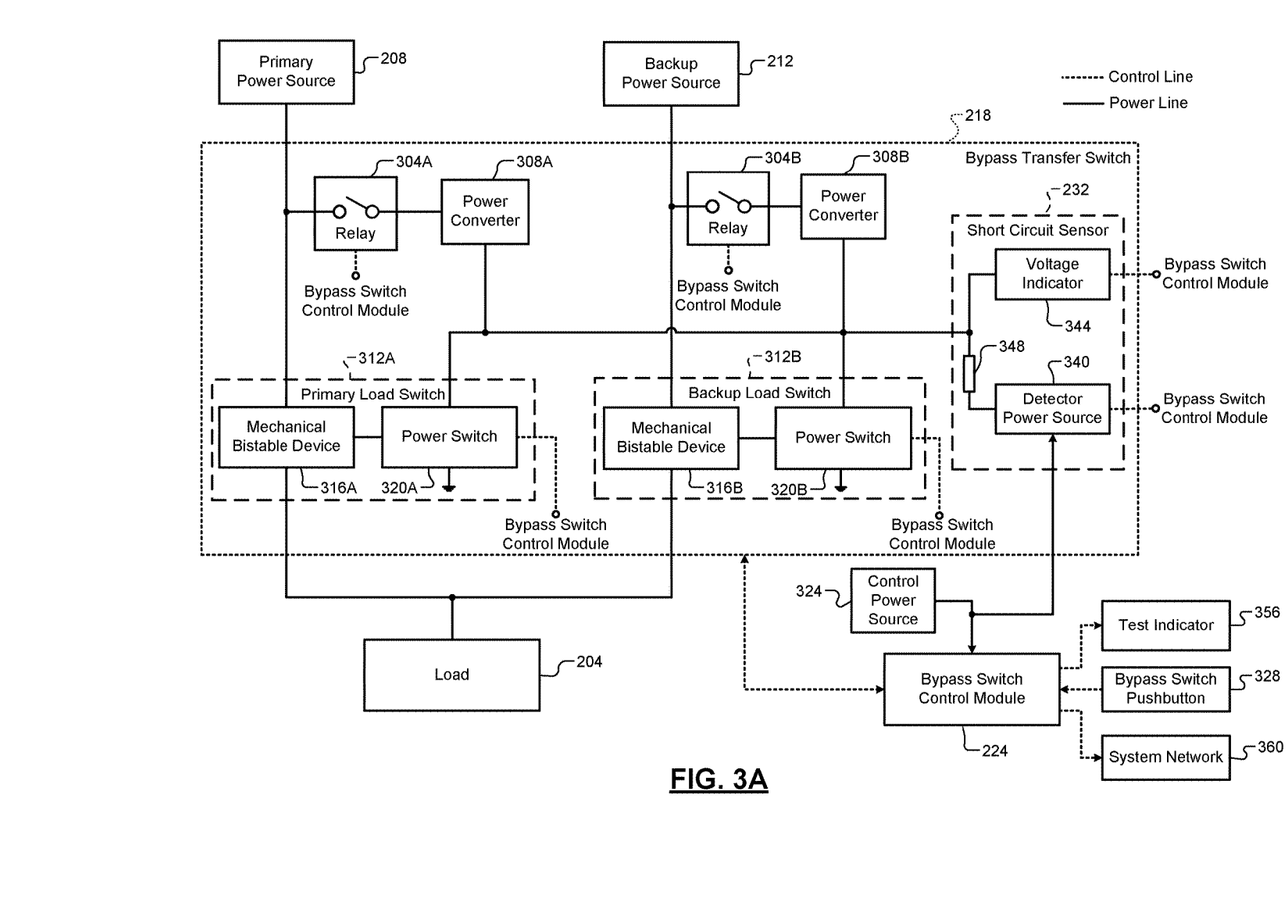
FIG. 3A is a block diagram of an example bypass transfer switch having the short circuit sensor.

With reference to FIG. 3A, an example embodiment of the BTS 218 is illustrated. The BTS 218 is connected to the primary power source 208 and the backup power source 212 by separate but similar relay/switch arrangements. Accordingly, the following description with respect to the connection between the BTS 218, the primary power source 208, and the load 204 is also applicable to the connection between the BTS 218, the backup power source 212, and the load 204. In the following description, similar components are referred to using the same reference number, with components used to connect to the primary power source 208 indicated by the suffix "A" and components used to connect to the backup power source 212 indicated by the suffix "B".

To connect between the primary power source 208 and the load 204, the BTS 218 includes a relay 304A, a power converter 308A, and a primary load switch 312A. The relay 304A electrically connects the primary power source 208 to the power converter 308A, which converts the alternating current supplied by the primary power source 208 to a direct current to power the components of the BTS 218, such as the primary load switch 312A.

The primary load switch 312A selectively connects the load 204 to the primary power source 208. In the example embodiment, the primary load switch 312A includes a mechanical bistable device 316A and a power switch 320A. The mechanical bistable device 316A may be actuated to a first position or a second position by the power switch 320A. In the first position, the mechanical bistable device 316A electrically connects the load 204 with the primary power source 208, such that the load 204 receives power from the primary power source 208. In the second position, the mechanical bistable device 316A disconnects the load 204 from the primary power source 208, such that the load 204 does not receive power from the primary power source 208. Thus, with the mechanical bistable device 316A in the first position, the primary load switch 312A is in a closed state, and with the mechanical bistable device 316A in the second position, the primary load switch 312A is in an open state.

The mechanical bistable device 316A may include a solenoid that moves the mechanical bistable device 316A between the first position and the second position. The power switch 320A may include a power semiconductor device that performs as a switch to turn on/off power to the solenoid from the power converter 308A. That is, when the power switch 320A is closed, the power switch 320A supplies power to the solenoid from the power converter 308A to energize the solenoid and actuate the mechanical bistable device 316A. On the other hand, when the power switch 320A is open, the power switch 320A does not supply power to the solenoid from the power converter 308A, and the mechanical bistable device 316A remains in the same position. This property, where no power is required to maintain the mechanical bistable device 316A in either position, may be labeled as "bistable."

The bypass switch control module 224 controls the power switch 320A. The bypass switch control module 224 maintains the power switch 320A in the closed position until the mechanical bistable device 316A is switched to a desired position. Once the mechanical bistable device 316A is at the desired position, the bypass switch control module 224 opens the power switch 320A and the mechanical bistable device 316A remains in the desired position until actuated again by the solenoid. To ensure that the mechanical bistable device 316A is at the desired position before the power switch 320A is opened, the bypass switch control module 224 may monitor the position of the mechanical bistable device 316A by way of a sensor.

The BTS 218 controls the position of the primary load switch 312A and the backup load switch 312B, so that only one of the power sources 208, 212 is supplying power to the load 204 at a time. Accordingly, if the primary load switch 312A electrically connects the load 204 to the primary power source 208, the load 204 remains disconnected from the backup power source 212 by the backup load switch 312B.

Figure 3B:
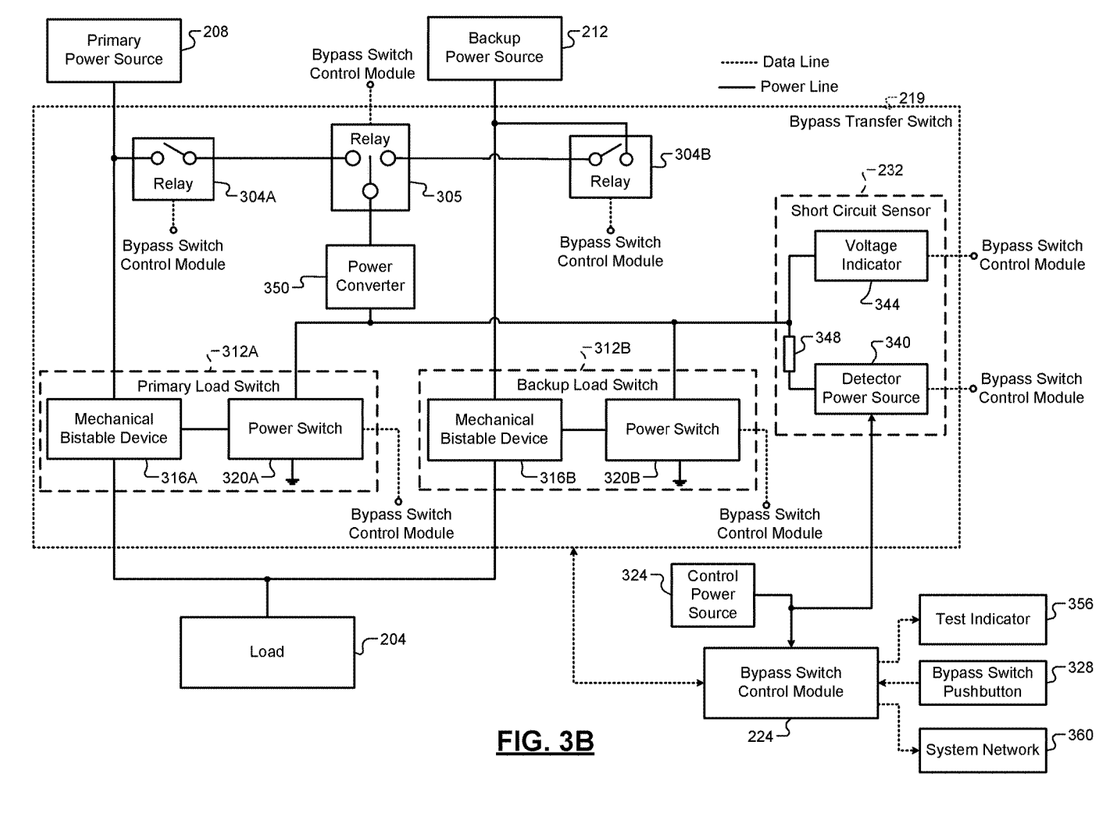
FIG. 3B is a block diagram of another example bypass transfer switch having the short circuit sensor.

In FIG. 3B, another example implementation shows a BTS 219, which includes a secondary relay 305 connected to the relay 304A and the relay 304B. The secondary relay 305 is a double throw relay (such as a single pole, double throw relay) that is controlled by the bypass switch control module 224. The common terminal of the relay 305 is connected to a power converter 350, which may be implemented similarly to the power converters 308A, 308B.

To electrically connect the power converter 350 to the primary power source 208, the relay 304A is closed and the secondary relay 305 connects the relay 304 to the power converter 350. Similarly, to electrically connect the power converter 350 to the backup power source 212, the relay 304B is closed and the secondary relay 305 connects the relay 304B to the power converter 350.

Returning to FIG. 3A, the bypass switch control module 224 receives power from a control power source 324 that may continuously provide power to the bypass switch control module 224. The control power source 324 may be an isolated power supply, and may include a battery or a buck converter that is separate from the power converters 308A, 308B but may still be connected to at least one of the power sources 208, 212.

The control power source 324 supplies voltage to power the bypass switch control module 224 (e.g., 12V, 15V, 24V). The bypass switch control module 224 controls the position of the relays 304A, 304B and the state of the power switches 320A, 320B by one or more control signals transmitted along one or more control lines. For example, the bypass switch control module 224 may transmit binary values (i.e., zero/one) for opening/closing the relays 304A, 304B and the power switches 320A, 320B. In the example embodiment, the portion of the BTS 218 that receives high electric current and voltage is galvanically isolated from the portion of the BTS 218 that receives control signals from the bypass switch control module 224.

The bypass switch control module 224 activates the BTS 218 when an activation signal is received in response to an operation performed by the operator. As an example, the operator may activate the BTS 218 by actuating a bypass switch pushbutton 328 that is located at the BTS 218 as part of the one or more control switches. In response to the actuation of the bypass switch pushbutton 328 by the operator, the bypass switch pushbutton 328 transmits a signal indicative of the operator's intention to turn on the BTS 218 to the bypass switch control module 224.

Before electrically connecting the power converters 308A, 308B of the BTS 218 to the power sources 208, 212, the bypass switch control module 224 employs the short circuit sensor 232 to determine whether a short circuit is present in either one of the power switches 320A, 320B of the BTS 218. Normally, neither one of the load switches 312A, 312B are in a closed position to electrically connect the load 204 to the power sources 208, 212 until the BTS 218 is to be used. Once the BTS 218 is turned on, either the primary load switch 312A or backup load switch 312B can be closed. However, in the event the power switch of the load switch that is to remain open has a short circuit, the open load switch may actually close, leading to both the primary power source 208 and the backup power source 212 being connected together at the load 204.

As an example, when the load 204 is to be electrically connected to the primary power source 208 by way of the primary load switch 312A, the bypass switch control module 224 will control the relay 304A to connect the power converter 308A to the primary power source 208. If the power switch 320B of the backup load switch 312B is shorted, as soon as the power converter 308A is connected to the primary power source 208, electric current will flow through the shorted power switch 320B to actuate the mechanical bistable device 316B.

If the bypass switch control module 224 is unaware of the changed position of the mechanical bistable device 316B, the bypass switch control module 224 will close the power switch 320A to actuate the mechanical bistable device 316A to connect the load 204 to the primary power source 208. The backup power source 212 and the primary power source 208 are then both connected to the load 204, and shorted together.

Another failure mode if the power switch 320B of the backup load switch 312B is shorted occurs when the mechanical bistable device 316A is closed and a request arrives to open the mechanical bistable device 316A. Once the power converter 308A or 308B provides power to the power switch 320A, current will also flow through the shorted power switch 320B, closing the mechanical bistable device 316B and shorting the backup power source 212 and the primary power source 208.

Short Circuit Sensor

The short circuit sensor 232 includes a detector power source 340 and a voltage indicator 344. A resistance component 348 is disposed between the detector power source 340 and the power switches 320A, 320B of the load switches 312A, 312B. The resistance component 348 forms a voltage divider with the parallel combination of the power switches 320A, 320B. The input voltage is supplied by the detector power source 340 and the divided voltage (output voltage) is measured by the voltage indicator 344.

With the power switches 320A, 320B both in an open state, at least as far as the bypass switch control module 224 is aware, the detector power source 340 applies a voltage to the voltage divider. If either of the power switches 320A, 320B is shorted (abnormal operation), their effective resistance will be very low, so the divided voltage will be close to zero. When both of the power switches 320A, 320B are open (normal operation), they will present a very high resistance, and the divided voltage will be close to the voltage supplied by the detector power source 340.

A lower bound on the resistance value of the resistance component 348 may be determined to allow detection of near-short conditions of the power switches 320A, 320B. When a true short (approximately a zero-ohm resistance) is present across the power switches 320A, 320B, the divided voltage will be approximately zero. However, if a near-short condition is present in one of the power switches 320A, 320B, a non-zero resistance may be present.

For example, the resistance across the power switches 320A, 320B may be 100 ohms in such a case (which is much lower than the resistance of the power switches 320A, 320B should be when supposedly turned off). If the resistance component 348 is only 100 ohms, the divided voltage would only be halfway between the voltage of the detector power source 340 and zero. This may not be low enough to be detected as a short circuit condition. As a result, the resistance value of the resistance component 348 can be increased to detect near-short conditions that present resistances further away from zero ohms.

An upper limit on the resistance value of the resistance component 348 may be determined based on the current draw of the voltage indicator 344 (a lower input impedance may correspond to a higher current draw). If the resistance value of the resistance component 348 is too high, the current drawn by the voltage indicator 344 may reduce the divided voltage down to a level that is detected as a short circuit.

Figure 4:
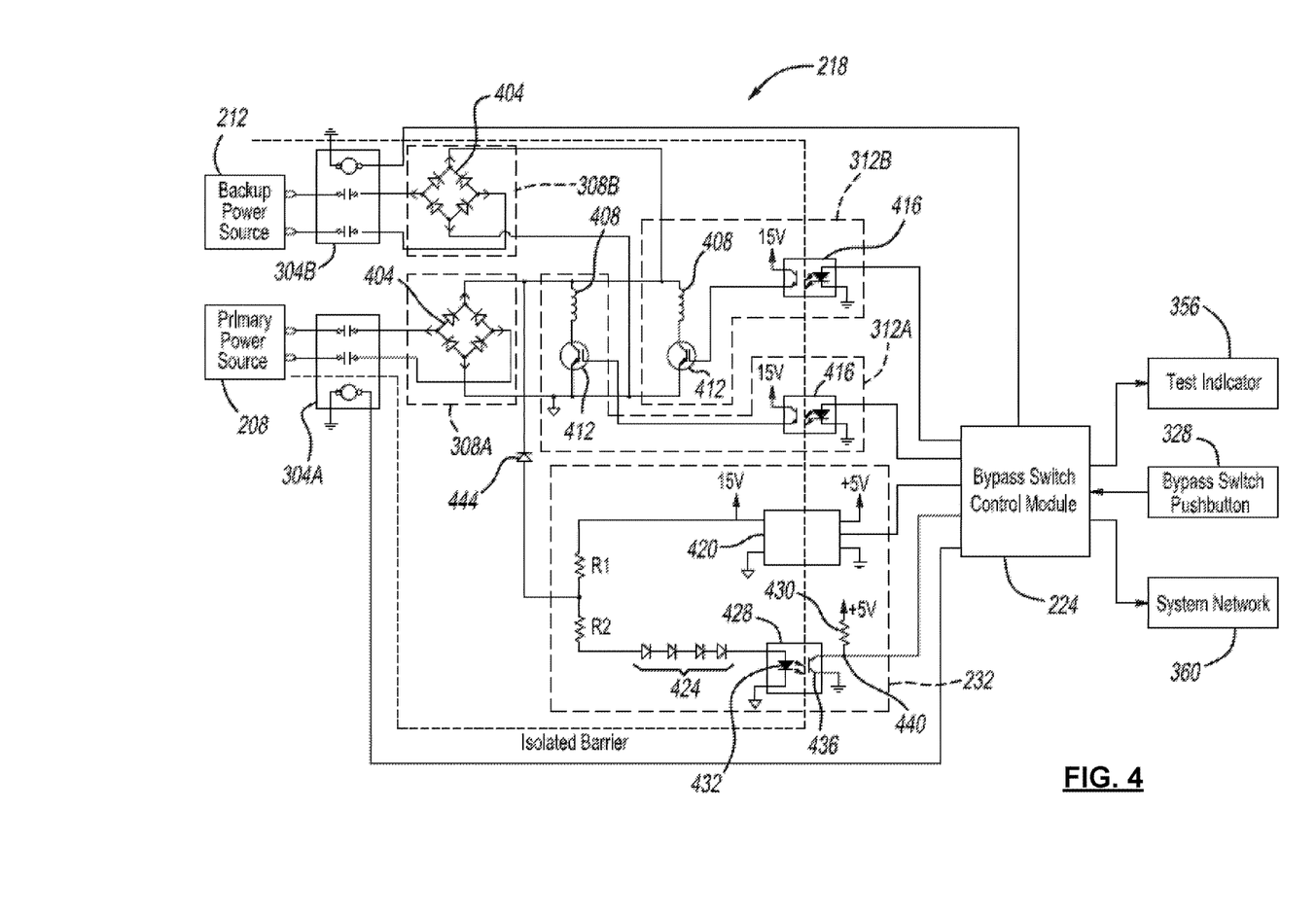
FIG. 4 is a schematic diagram of an example bypass transfer switch.

The resistance component 348 may include a discrete resistor, as is shown in FIG. 4, and/or may include the output impedance of the detector power source 340 or another electrical component that allows for a voltage drop between the detector power source 340 and the voltage measured by the voltage indicator 344.

The detector power source 340 may be an isolated power supply that is turned on/off by the bypass switch control module 224. The detector power source 340 may receive power from the control power source 324 and/or may include a separate power supply such as a battery. The detector power source 340 supplies a voltage, such as 12V, 15V, or 20V, that may be significantly lower than the voltage of the power sources 208, 212 and significantly lower than the outputs of the power converters 308A, 308B. The detector power source 340 may be designed so that, even if one of the power switches 320A, 320B is shorted, the power supplied by the detector power source 340 is insufficient to change the positions of the mechanical bistable devices 316A, 316B.

The voltage indicator 344 monitors the voltage at the node between the resistance component 348 and the power switches 320A, 320B. The voltage indicator 344 outputs a signal to the bypass switch control module 224 indicative of the voltage being received by the power switches 320A, 320B. For example, the voltage indicator 344 may output a high voltage level (e.g., 5V) when the detector power source 340 voltage detected is greater than a predetermined threshold and may output a low voltage (e.g., 0V) when the voltage detected is less than or equal to the predetermined threshold. The predetermined threshold is based on the voltage that the voltage indicator 344 should detect if a short is present or not present. As an example, the predetermined threshold may be a predetermined percentage (such as 50%) of the voltage output by the detector power source 340. The voltage indicator 344 may also output an analog or digital representation of the actual voltage value detected.

In an example short circuit detection routine, the bypass switch control module 224 maintains the relays 304A, 304B in an open state. The primary load switch 312A and the backup load switch 312B may be opened to have the load 204 disconnected from the power sources 208, 212. The bypass switch control module 224 then turns on the detector power source 340 to supply a low voltage to the power switches 320A, 320B. If neither of the power switches 320A, 320B are shorted, no current flows from the detector power source 340 to the power switches 320A, 320B. The voltage indicator 344 detects a first voltage level at the node between the resistance component 348 and the power switches 320A, 320B.

If one of the power switches 320A, 320B is shorted, electric current flows from the detector power source 340 to the resistance component 348, then to the shorted power switch, and to ground. The voltage indicator 344 detects a second voltage level that is less than the first voltage level.

The voltage indicator 344 outputs a signal to the bypass switch control module 224 indicative of either the first voltage level or the second voltage level. The bypass switch control module 224 associates the first voltage level with a non-shorted condition of the power switches 320A, 320B, and the second voltage level with a shorted condition of at least one of the power switches 320A, 3206.

If the signal received from the voltage indicator 344 reflects the first voltage level, the bypass switch control module 224 determines that neither one of the power switches 320A, 320B is shorted and continues normal operations. If the signal received from the voltage indicator 344 reflects the second voltage level, the bypass switch control module 224 determines that at least one of the power switches 320A, 320B is shorted.

The bypass switch control module 224 may notify the operator of the shorted power switch by, for example, outputting an alarm via a test indicator 356 and/or transmitting a message to the operator via a system network 360. The test indicator 356 may include, for example, a visual alarm such as a flashing light located next to the pushbutton 328 and/or an audio alarm such as a siren.

Schematic

Referring to FIG. 4, an example schematic circuit diagram of the BTS 218 is illustrated. In the example embodiment, the power sources 208, 212 are connected at the relay 304A, 304B. The power converters 308A, 308B are rectifiers 404 that receive power from the power sources 208, 212 via relays 304A, 304B and output pulsating DC power to the primary load switch 312A and the backup load switch 312B.

The primary load switch 312A and the backup load switch 312B each include a coil 408, an IGBT (insulated gate bipolar transistor) 412, and an IGBT driver 416. Although an IGBT is shown, other switch components, such as a FET (field effect transistor) or other BJT (bipolar junction transistor) may be used.

The coil 408 is part of a solenoid for actuating the mechanical bistable device 316A, 316B. In other words, passing current through one of the coils 408 creates an electromagnetic field that acts on an armature of the corresponding mechanical bistable device 316A, 316B to change the position of the corresponding mechanical bistable device 316A, 316B.

The IGBTs 412 and the IGBT drivers 416 are part of the power switches 320A, 320B. The IGBT 412 acts as a switch to open and close an electrical path to the coil 408. More particularly, when voltage is applied at the gate of the IGBT 412, the IGBT 412 forms a closed circuit path between the collector and emitter of the IGBT 412 allowing electric current to flow through the coil 408.

Conversely, when no voltage is applied to the gate of the IGBT 412, the IGBT 412 forms an open circuit between the collector and emitter, thereby preventing current from flowing through the coil 408. The IGBT driver 416 is controlled by the bypass switch control module 224 for applying the necessary voltage to the gate of the IGBT 412 to close the path to the coil 408. The voltage used to activate the IGBT may be based on the IGBT being used and is, therefore, not limited to the 15V shown in FIG. 4.

With the power converter 308A, 308B supplying power to the primary load switch 312A and the backup load switch 312B, the bypass switch control module 224 may change the position of a given mechanical bistable device 316A, 316B by closing the respective IGBT 412. For example, the bypass switch control module 224 transmits a high voltage (e.g., 5V) to the IGBT driver 416, and the IGBT driver 416 applies a voltage to the gate of the IGBT 412.

Electric current from the rectifiers 404 flows through the coil 408 of the solenoid and the IGBT 412, thereby changing the position of the mechanical bistable device 316A, 316B. After moving the mechanical bistable device 316A, 316B, the IGBT driver 416 removes the voltage applied to the gate of the IGBT 412, preventing the flow of current through the coil 408 and IGBT 412.

The short circuit sensor 232 includes an isolated power source 420 (as the detector power source 340), a resistor R1, a resistor R2, a series of diodes 424, an optocoupler 428, and a pull-up resistor 430. The optocoupler 428 includes a light emitting diode (LED) 432 and phototransistor 436. The optocoupler 428 and the pull-up resistor 430 are connected at an output node 440. The phototransistor 436 of the optocoupler 428 is connected between the output node and ground, and the pull-up resistor 430 is connected between the output node and a supply voltage, such as 5V.

The resistance component 348 of FIGS. 3A, 3B includes the resistor R1, and the voltage indicator 344 of FIGS. 3A, 3B includes the resistor R2, the series of diodes 424, the optocoupler 428, and the pull-up resistor 430. A diode 444 connects the short circuit sensor 232 to the outputs of the rectifiers 404 so that when the rectifiers 404 are active, current doesn't flow back to the short circuit sensor 232.

The bypass switch control module 224 determines whether one of the IGBTs 412 is shorted based on the voltage at the output node 440. During the short circuit detection routine, the isolated power source 420 is turned on by the bypass switch control module 224. The isolated power source 420 applies 15V to the load switches 312A, 312B. In various implementations, the isolated power source 420 may also provide power to the IGBT drivers 416, and may therefore also be turned on in order to drive the IGBTs 412 using the IGBT drivers 416.

In the event one of the IGBTs 412 is shorted, current flows to the shorted IGBT. The node between R1 and R2 (referred to as the test node) is therefore pulled low by the current flowing through the shorted IGBT. The voltage at the test node may then be too low to allow the series of diodes 424 and the optocoupler 428 to turn on, causing the phototransistor 436 to remain off. There is therefore no current through the pull-up resistor 430, and so the output node 440 remains at 5V. The bypass switch control module 224 detects the high voltage at the output node 440 and determines that one of the IGBTS 412 is shorted, and outputs an alarm via the test indicator 356.

Alternatively, in the event neither of the IGBTs 412 is shorted, electric current flows towards the optocoupler 428 and not the IGBTs 412. That is, electric current flows through the resistor R1, the resistor R2, the series of diodes 424, and the LED 432, thereby turning on the phototransistor 436. The phototransistor 436 draws current through the pull-up resistor 430, creating a voltage drop across the pull-up resistor 430 and grounding the output node 440. Accordingly, the bypass switch control module 224 detects the low voltage at the output node 440 and determines that neither one of the IGBTs 412 is shorted.

In the example embodiment, the short circuit sensor 232 is described in relation with the BTS 218. However, the short circuit sensor 232 may be employed to detect a short circuit in other circuit systems, such as an automatic transfer switch, and is not limited to non-automatic transfer switches.

The voltage indicator 344 of the short circuit sensor 232 is described as detecting a voltage at an input of the power switches 320A, 320B. In other implementations, the voltage indicator 344 may monitor the current received by the power switches 320A, 320B and may output a signal to the bypass switch control module 224 that indicates the amount of current detected.

Methods

Figure 5:
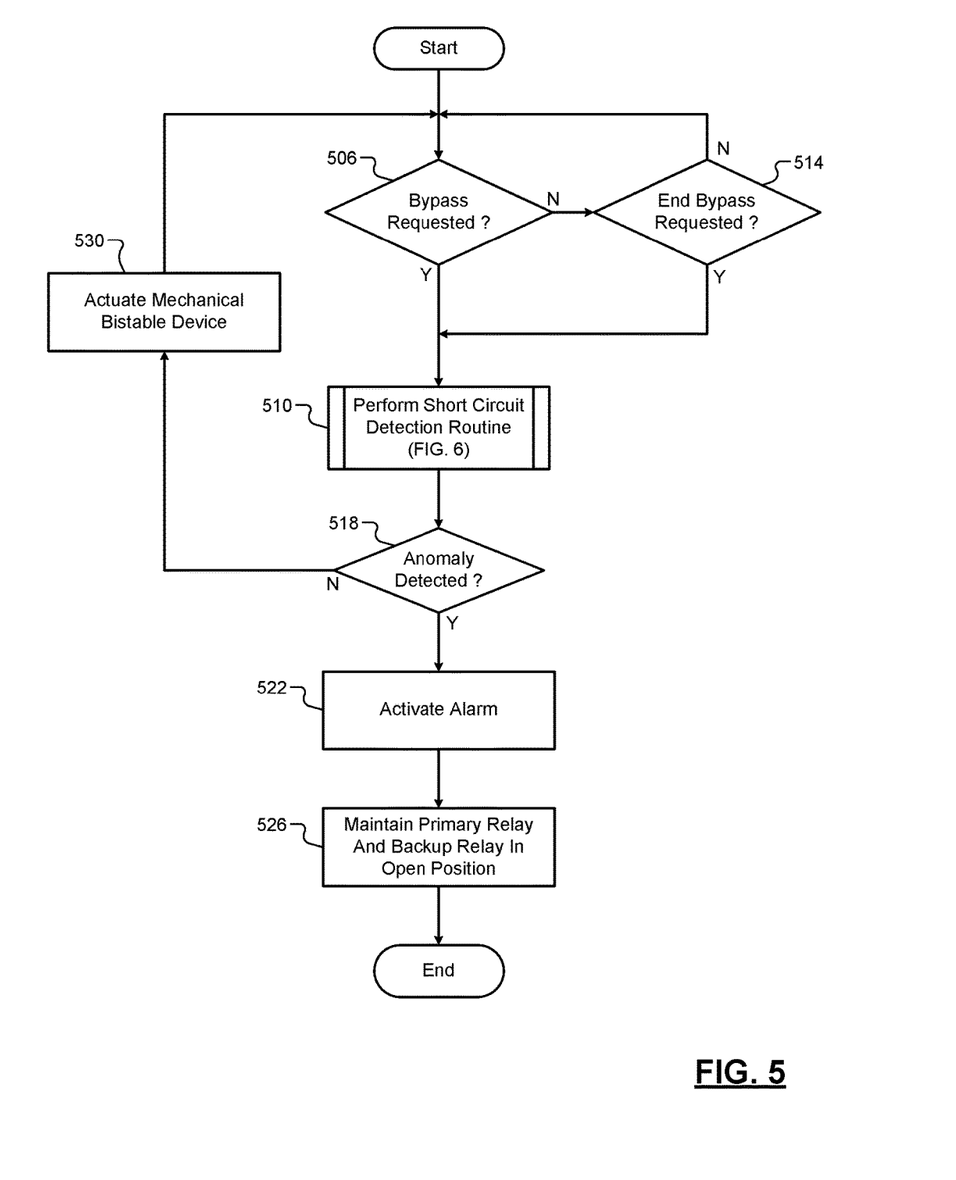
FIG. 5 is a flowchart of example short circuit detection control.

In FIG. 5, example operation for initiating the short circuit detection routine is described. The operation of FIG. 5 may be performed by the bypass switch control module 224. Operation begins at 506, where control determines whether activation of the BTS is requested—that is, that the BTS should connect the load to one of the power sources, bypassing the ATS. For example, the ATS can then be tested, maintained, or replaced, while the BTS is bypassing the ATS. For example, control may determine that activation of the BTS is requested based on a signal from a pushbutton.

If bypass activation is requested, control transfers to 510; otherwise, control continues to 514. At 514, control determines whether BTS deactivation is requested—that is, the ATS is back in the system and the BTS no longer needs to connect the load to a power source. If an end to the bypass has been requested, control transfers to 510; otherwise, control returns to 506.

Figure 6:
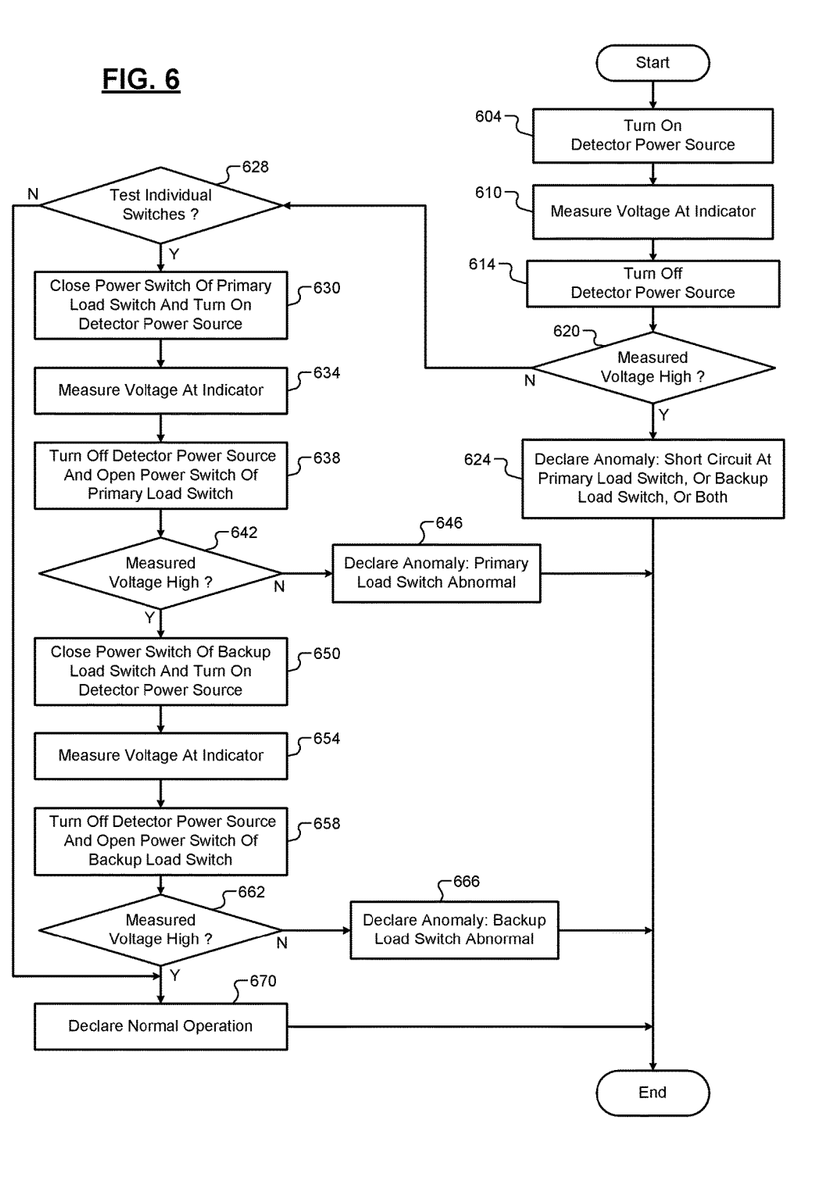
FIG. 6 is a flowchart of an example short circuit detection routine.

At 510, a short circuit detection routine is performed, an example of which is provided in FIG. 6. Then, at 518, control determines whether an anomaly has been detected. If an anomaly has been detected, control transfers to 522 to perform an abnormal operation routine. For example, control may activate an alarm at 522 and maintain the relays in an open position at 526.

If, at 518, an anomaly has not been detected, control transfers to 530. At 530, a mechanical bistable device of the BTS is controlled to begin or end the bypass operation, depending on the request determined at 506 or 514. For example, when the bypass is requested, and the ATS is presently connecting the load to the primary power source, the BTS actuates the first mechanical bistable device to connect the load to the primary power source. Meanwhile, when the bypass is requested, and the ATS is presently connecting the load to the backup power source, the BTS actuates the second mechanical bistable device to connect the load to the backup power source.

To end bypass (as determined by 514), the BTS actuates, depending on which mechanical bistable device is currently conducting, the first mechanical bistable device to disconnect the load from the primary power source or the second mechanical bistable device to disconnect the load from the backup power source.

If, during bypass, the BTS is requested (not shown) to change the load from the primary power source to the backup power source, or vice versa, the BTS performs a short circuit detection routine (as at 510) before disconnecting the load from the previous power source. The BTS then performs another short circuit detection routine before connecting the load to the next power source.

FIG. 6 shows an example short circuit detection routine invoked at 510 of FIG. 5, which may be performed by the bypass switch control module 224. The method of FIG. 6 may also be performed in response to a specific test request, which may be indicated by a user pressing a physical button or by an electronic request, such as may be received from a remote operator via the system network 360. When control begins, the relays, the primary load switch, and the backup load switch are open. That is, the power converters are electrically disconnected from the power sources and the load is not connected to either of the power sources.

Control begins at 604, where control turns on the detector power source of the short circuit sensor and at 610 measures the voltage at the output of the voltage indicator. At 614, control turns off the detector power source and at 620, control determines whether the measured voltage is high. If the measured voltage is high, control declares an anomaly at 624. In particular, control determines that a short circuit is present in at least one of the load switches.

When the measured voltage is not high, control determines, at 628, whether each of the load switches should be tested individually for an anomaly. Specifically, control determines whether each of the power switches of the load switches should be tested. The bypass switch control module may be configured to test each of the power switches individually at, for example, a start-up of the BTS, a transfer back to the ATS, a preset interval, and/or other suitable operational point of the BTS.

If control determines, at 628, not to test the load switches individually at the present time, then control declares normal operation of the BTS at 670 and ends. Otherwise, if the load switches should be tested individually, control begins by testing the primary load switch. In particular, at 630, control closes the power switch of the primary load switch and turns on the detector power source 340 of the short circuit sensor. At 634, control measures the voltage at the output of the voltage indicator and, at 638, turns off the detector power source 340 and opens the power switch of the primary load switch.

Control then determines, at 642, whether the measured voltage is high. If the measured voltage is not high, control declares, at 646, an anomaly of the power switch of the primary load switch. Specifically, when the power switch is closed, electric current should flow through the power source and, in the configuration of FIGS. 3A, 3B, and 4, the voltage indicator should output a high voltage in response to this short circuit. Therefore, if the voltage is not high, the power switch is not operating correctly. Note that other configurations are possible, such as one in which a low voltage indicates a short circuit.

If the measured voltage is high, control tests the backup load switch. That is, at 650, control closes the power switch of the backup load switch and turns on the detector power source. At 654, control measures the voltage at the voltage indicator and, at 658, turns off the detector power source 340 and opens the power switch of the backup load switch. At 662, control determines whether the measured voltage is high. If the measured voltage is not high, control declares an anomaly at 666 of the backup load switch. If the measured voltage is high, then control declares normal operation of the BTS at 670 and ends.

After determining the measured voltage is high at 662, control may also return to 602 to retest the BTS once more for a short circuit by repeating elements 602-624. If the measured voltage is not high at 620, control may skip 628 and proceed to 670, where normal operation is declared.

From 624, 646, 666, and 670, the operation of FIG. 6 ends, which may correspond to a return to FIG. 5, where control proceeds at 518 to determine whether an anomaly is detected.

Overall

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A short circuit detection circuit for an electrical switch, the electrical switch being connected in series with a load and selectively being connected in series with a first power supply, the short circuit detection circuit comprising:
a secondary power supply, wherein the secondary power supply is limited in comparison to the first power supply in terms of at least one of an operating voltage and an available current;
a first resistance including a first end electrically connected to the secondary power supply and a second end electrically connected to a first terminal of the electrical switch;
a voltage measurement circuit configured to measure a voltage at the second end of the first resistance; and
a controller configured to, while a control signal present at a control terminal of the electrical switch is in an open state, perform a first sequence of operations, the first sequence including:
energizing the secondary power supply;
while the secondary power supply is energized, obtaining a first voltage measurement from the voltage measurement circuit;
in response to the first voltage measurement indicating that a voltage across the first resistance is greater than a predetermined threshold, identifying a low-resistance condition in the electrical switch; and
subsequent to obtaining the first voltage measurement, de-energizing the secondary power supply,
wherein the open state of the control signal controls the electrical switch to create an open circuit between the first terminal of the electrical switch and a second terminal of the electrical switch.

2. The short circuit detection circuit of claim 1, wherein the controller is configured to perform the first sequence of operations prior to the first power supply being electrically connected to the electrical switch.

3. The short circuit detection circuit of claim 1, wherein the controller is configured to, while the control signal present at the control terminal of the electrical switch is in a closed state, perform a second sequence of operations, the second sequence including:
while the secondary power supply is energized, obtaining a second voltage measurement from the voltage measurement circuit; and
in response to the second voltage measurement indicating that the voltage across the first resistance is less than a second predetermined threshold, identifying a switching deficiency in the electrical switch,
wherein the closed state of the control signal controls the electrical switch to create a short circuit between the first and second terminals of the electrical switch.

4. The short circuit detection circuit of claim 1, further comprising a diode configured to electrically connect the second end of the first resistance to the electrical switch.

5. The short circuit detection circuit of claim 1, wherein the load includes an inductive loop configured to change a state of a mechanical bistable device.

6. A failure detector for a transfer switch, the transfer switch being operable to alternately connect a load to a first power source and a second power source, the failure detector comprising:
a short circuit sensor, wherein
the short circuit sensor includes a detector power source and a voltage indicator,
the detector power source is operable to apply an input voltage to a power switch within the transfer switch,
the voltage indicator senses a first voltage across the power switch at a first node, and
the voltage indicator generates a first output in response to the first voltage being greater than a predetermined threshold and outputs a second output in response to the first voltage being less than the predetermined threshold; and
a control module configured to energize the detector power source and declare that
(i) the transfer switch is normal in response to the short circuit sensor outputting the first output, and
(ii) the transfer switch has a short circuit in response to the short circuit sensor outputting the second output.

7. A transfer switching system comprising:
the failure detector of claim 6; and
the transfer switch, wherein the transfer switch includes an electromechanical switch that selectively connects the load to the first power source, and wherein the power switch actuates the electromechanical switch.

8. The transfer switching system of claim 7, wherein the electromechanical switch is stable in (i) a first state where the load and the first power source are electrically connected and (ii) a second state where the load and the first power source are electrically disconnected.

9. The transfer switching system of claim 7, wherein the power switch actuates the electromechanical switch using power from a power converter, and wherein the detector power source supplies less power to the power switch than does the power converter.

10. The transfer switching system of claim 7, wherein the transfer switch further includes:
a second electromechanical switch that selectively connects the load to the second power source and
a second power switch that actuates the second electromechanical switch,
wherein the power switch and the second power switch are connected in parallel, and
wherein the control module declaration that the transfer switch has the short circuit indicates that at least one of the power switch and the second power switch is short-circuited.

11. The transfer switching system of claim 7, wherein the control module also controls whether the load is connected to the first power source and whether the load is connected to the second power source.

12. The failure detector of claim 6 wherein the short circuit sensor further includes a diode connected between the first node and the power switch.

13. The failure detector of claim 6 wherein the short circuit sensor further includes a resistor connected between the first node and the detector power source.

14. The failure detector of claim 6 wherein the detector power source is an isolated power supply, and wherein the voltage indicator includes an optocoupler.

15. The failure detector of claim 14 wherein the isolated power supply also provides power to a first driver that drives a control terminal of the power switch.

16. The failure detector of claim 6 wherein the voltage indicator includes a resistor and at least one series-connected diode.

17. The failure detector of claim 16 wherein the at least one series-connected diode includes four diodes connected in series.

18. The failure detector of claim 16 wherein the voltage indicator includes an optocoupler, wherein an input of the optocoupler is in series with the resistor and the at least one series-connected diode, and wherein an output of the optocoupler provides the output from the short circuit sensor to the control module.

19. The failure detector of claim 18 wherein the short circuit sensor includes a pull-up resistor connected between a voltage supply and the output of the optocoupler.

20. The failure detector of claim 6 wherein the control module generates an alarm in response to the transfer switch having a short circuit, wherein the alarm is at least one of visual and audible.

* * * * *